United States Patent
Kanno et al.

(10) Patent No.: US 8,085,577 B2
(45) Date of Patent: Dec. 27, 2011

(54) NONVOLATILE SEMICONDUCTOR MEMORY DEVICE AND METHOD OF DATA WRITE/DATA ERASE THEREIN

(75) Inventors: Hiroshi Kanno, Kawasaki (JP); Reika Ichihara, Yokohama (JP); Takayuki Tsukamoto, Kawasaki (JP); Kenichi Murooka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 148 days.

(21) Appl. No.: 12/713,667

(22) Filed: Feb. 26, 2010

(65) Prior Publication Data

US 2011/0026299 A1 Feb. 3, 2011

(30) Foreign Application Priority Data

Aug. 3, 2009 (JP) ................. 2009-180565

(51) Int. Cl.
*G11C 11/00* (2006.01)
(52) U.S. Cl. .................... 365/148; 365/189.11
(58) Field of Classification Search .................. 365/148, 365/189.11, 226
See application file for complete search history.

(56) References Cited

U.S. PATENT DOCUMENTS

| | | | | |
|---|---|---|---|---|
| 7,920,408 B2 * | 4/2011 | Azuma et al. | ................. | 365/148 |
| 2010/0321982 A1* | 12/2010 | Takagi et al. | ................. | 365/148 |
| 2011/0122680 A1* | 5/2011 | Ikeda et al. | .................... | 365/148 |
| 2011/0128772 A1* | 6/2011 | Kim et al. | .................... | 365/148 |

FOREIGN PATENT DOCUMENTS

JP 2005-522045 7/2005

OTHER PUBLICATIONS

U.S. Appl. No. 12/563,470, filed Sep. 21, 2009, Takayuki Tsukamoto et al.
A. Beck, et al. "Reproducible switching effect in thin oxide films for memory applications" Applied Physics Letters, vol. 77, No. 1, Jul. 3, 2000, pp. 139-141.
Yu-Sheng Chen, et al. "Forming-free HfO$_2$ Bipolar RRAM Device with Improved Endurance and High Speed Operation," 2009. Int. Symp. VLSI Tech. System and Applications, Apr. 2009, pp. 37-38.

* cited by examiner

*Primary Examiner* — Anh Phung
(74) *Attorney, Agent, or Firm* — Oblon, Spivak, McClelland, Maier & Neustadt, L.L.P.

(57) ABSTRACT

A nonvolatile semiconductor memory device comprises: a plurality of first lines; a plurality of second lines; a plurality of memory cells each disposed at each of crossing-points of the first lines and the second lines and each comprising a variable resistor and a bi-directional diode; and a voltage control circuit configured to control a voltage of selected one of the first lines, unselected ones of the first lines, selected one of the second lines, and unselected ones of the second lines, respectively. The variable resistor is configured to change its resistance value depending on a polarity of a voltage applied thereto. The voltage control circuit is configured to apply a voltage pulse to the selected one of the first lines and to connect a capacitor of a certain capacitance to one end of the selected one of the second lines.

17 Claims, 7 Drawing Sheets characteristics of variable resistor R characteristics of bi-directional diode D erase (resetting) operation (1)

selected memory cell M(sel) = M3,3
unselected memory cell M(unsel) = M1,1~M1,4, M2,1~M2,4, M3,1, M3,2, M3,4, M4,1~M4,4 erase (resetting) operation (2)

selected memory cell M(sel) = M3,3
unselected memory cell M(unsel) = M1,1~M1,4, M2,1~M2,4, M3,1, M3,2, M3,4, M4,1~M4,4

NONVOLATILE SEMICONDUCTOR MEMORY DEVICE AND METHOD OF DATA WRITE/DATA ERASE THEREIN

CROSS REFERENCE TO RELATED APPLICATIONS

This application is based upon and claims the benefit of priority from prior Japanese Patent Application No. 2009-180565, filed on Aug. 3, 2009, the entire contents of which are incorporated herein by reference.

BACKGROUND OF THE INVENTION

1. Field of the Invention

The present invention relates to a nonvolatile semiconductor memory device including electrically rewritable memory cells and a method of data write/data erase therein.

2. Description of the Related Art

In recent years, along with a rising level of integration in semiconductor devices, circuit patterns of transistors and the like which configure the semiconductor devices are being increasingly miniaturized. Required in this miniaturization of the patterns is not simply a thinning of line width but also an improvement in dimensional accuracy and positional accuracy of the patterns. This trend applies also to semiconductor memory devices.

Conventionally known and marketed semiconductor memory devices such as DRAM, SRAM, and flash memory each use a MOSFET as a memory cell. Consequently, there is required, accompanying the miniaturization of patterns, an improvement in dimensional accuracy at a degree exceeding a degree of the miniaturization. As a result, a large burden is placed also on the lithography technology for forming these patterns which is a factor contributing to a rise in product cost.

Accordingly, resistive memory is attracting attention as a candidate to succeed these kinds of semiconductor memory devices that utilize a MOSFET as a memory cell (refer, for example, to Japanese Unexamined Patent Application Publication (Translation of PCT Application) No. 2005-522045). The resistive memory herein includes a resistive RAM (ReRAM), and a phase Change RAM (PCRAM). The ReRAM, in a narrow sense, uses a transition metal oxide as a recording layer to store its resistance states in a non-volatile manner. The PCRAM uses chalcogenide or the like as a recording layer to utilize the resistance information of crystalline states (conductors) and amorphous states (insulators).

Two kinds of variable resistors in the aforementioned resistive memory are known. In one kind, known as a bipolar type, a high-resistance state and a low-resistance state are set by switching a polarity of an applied voltage (refer, for example, to OYO BUTURI (Applied Physics), Vol. 75, No. 09, p. 1109). In the other kind, known as a unipolar type, setting of the high-resistance state and the low-resistance state are made possible by controlling a voltage value and a voltage application time, without switching the polarity of the applied voltage.

In the case of bipolar type resistive memory, a memory cell array is configured by overlapping a variable resistor and a rectifier at crossing-points of bit lines and word lines, the rectifier being such as a MIM diode having non-linear current-voltage characteristics for both positive and negative polarities. Furthermore, arranging such memory cell arrays three-dimensionally in stacks enables a large capacity to be realized without transistors and causing an increase in cell array area.

Write of data to a memory cell is performed by applying to the variable resistor a short-lasting voltage pulse with a certain polarity. The variable resistor thereby changes from the high-resistance state to the low-resistance state. Hereinafter, this operation to change the variable resistor from the high-resistance state to the low-resistance state is called a setting operation.

In contrast, erase of data in a memory cell is performed by applying to the variable resistor in the low-resistance state subsequent to the setting operation a short-lasting voltage pulse with a polarity opposite to that of the short-lasting voltage pulse applied during the setting operation. The variable resistor thereby changes from the low-resistance state to the high-resistance state. Hereinafter, this operation to change the variable resistor from the low-resistance state to the high-resistance state is called a resetting operation. For example, in the case of binary data storage where the memory cell has the high-resistance state as a stable state (reset state), data write is performed by the setting operation which changes the reset state to the low-resistance state.

As described above, when driving a bipolar type memory cell, the memory cell must be applied with voltage pulses having a polarity that differs for setting and resetting. Consequently, in the case of bipolar type resistive memory, there is a need to configure voltage pulse generating circuits for generating, for example, a voltage pulse of a positive polarity on both an upper electrode side and lower electrode side of the memory cell. Alternatively, it becomes necessary to configure a voltage pulse generating circuit capable of generating a voltage pulse of both a positive and negative polarity on either of the upper or lower electrode sides. These both imply a large increase in area of peripheral circuits of the memory, and are thus a barrier to improving a level of integration in the memory.

SUMMARY OF THE INVENTION

In accordance with a first aspect of the present invention, a nonvolatile semiconductor memory device comprises: a plurality of first lines; a plurality of second lines extending so as to cross the first lines; a plurality of memory cells each disposed at each of crossing-points of the first lines and the second lines and each comprising a variable resistor and a bi-directional diode; a first select circuit configured to select one of the first lines; a second select circuit configured to select one of the second lines; and a voltage control circuit configured to control a voltage of selected one of the first lines, unselected ones of the first lines, selected one of the second lines, and unselected ones of the second lines, respectively, the variable resistor being configured to change its resistance value depending on a polarity of a voltage applied thereto, and the voltage control circuit being configured to apply a voltage pulse to the selected one of the first lines and to connect a capacitor of a certain capacitance to one end of the selected one of the second lines.

In accordance with a second aspect of the present invention, a method of data write/data erase in a nonvolatile semiconductor memory device, the nonvolatile semiconductor memory device including a plurality of first lines, a plurality of second lines extending so as to cross the first lines, and a plurality of memory cells each disposed at each of crossing-points of the first lines and the second lines and each comprising a variable resistor and a bi-directional diode, the variable resistor being configured to change its resistance value depending on a polarity of a voltage applied thereto, comprising: applying a voltage pulse to selected one of the first lines and connecting a capacitor of a certain capacitance to one end of selected one of the second lines, thereby charging the capacitor; discharging the capacitor subsequent to charging the capacitor; and changing the resistance value of the variable resistor by a voltage caused by charges discharged from the capacitor.

DETAILED DESCRIPTION OF THE EMBODIMENTS

Embodiments of a nonvolatile semiconductor memory device in accordance with the present invention are described below with reference to the drawings.

First Embodiment

[Circuit Configuration of a Nonvolatile Semiconductor Memory Device in Accordance with a First Embodiment]

Figure 1:
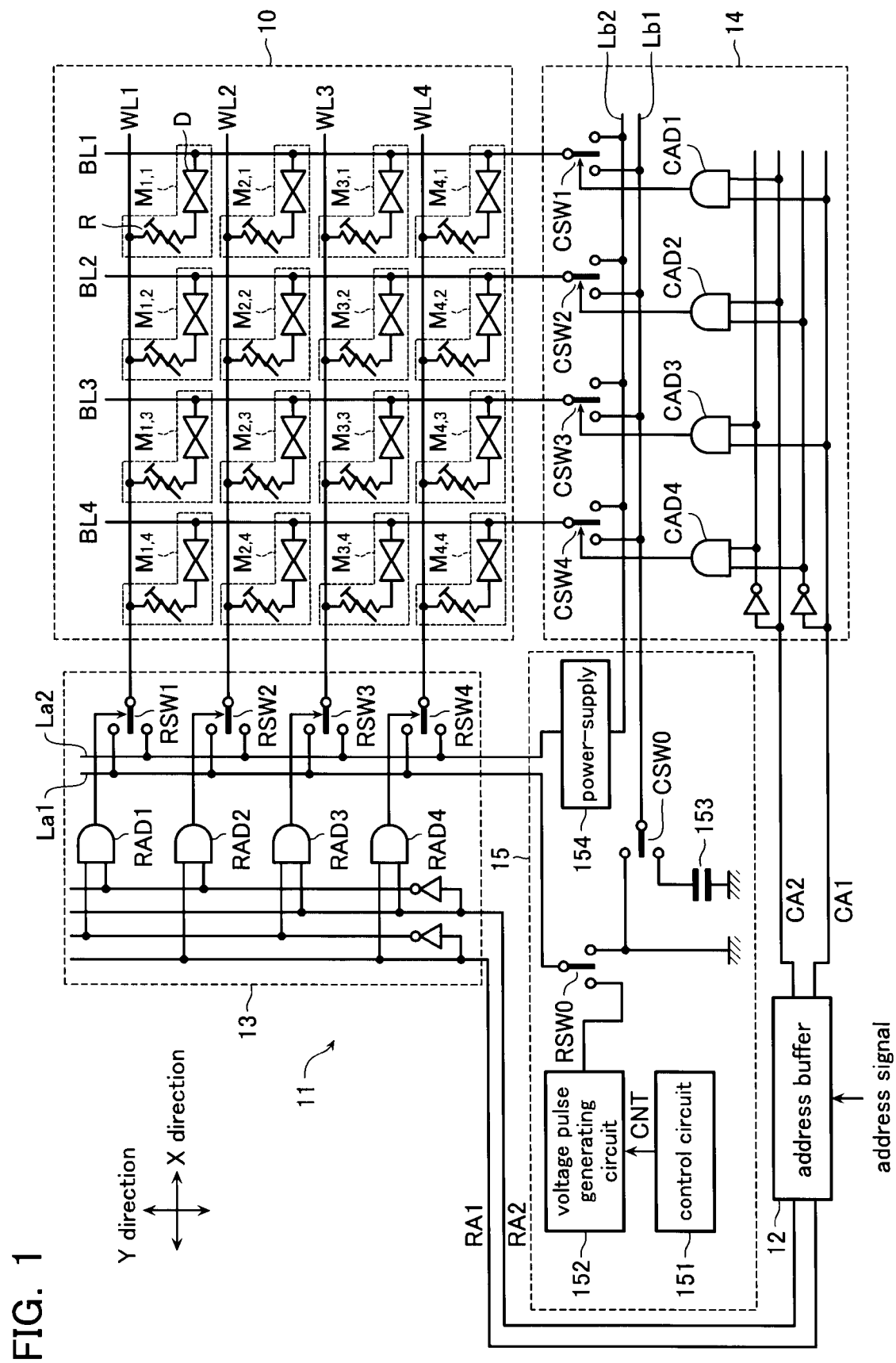
FIG. 1 is an equivalent circuit diagram of a nonvolatile semiconductor memory device in accordance with a first embodiment of the present invention.

FIG. 1 is an equivalent circuit diagram of a nonvolatile semiconductor memory device in accordance with a first embodiment of the present invention. As shown in FIG. 1, the nonvolatile semiconductor memory device in accordance with the first embodiment includes a memory cell array 10 configured to store data, and peripheral circuit 11 configured to control the memory cell array 10.

The memory cell array 10 includes word lines WL (WL1-WL4) and bit lines BL (BL1-BL4) that intersect each other, and memory cells M ($M_{1,1}$-$M_{4,4}$) disposed at crossing-points of the word lines WL and bit lines BL, as shown in FIG. 1. The word lines WL are formed so as to extend in an X direction and be arranged with a certain pitch in a Y direction. The bit lines BL are formed so as to extend in the Y direction and be arranged with a certain pitch in the X direction. That is, the memory cells M are disposed in a matrix in a plane formed by the X direction and the Y direction.

Each of the memory cells M includes a variable resistor R and a bi-directional diode D connected in series, as shown in FIG. 1. The variable resistor R is electrically re-writable and stores data in a nonvolatile manner based on a resistance value of the variable resistor R. The bi-directional diode D is disposed to prevent a sneak current during writing/reading. One end of the variable resistor R is connected to the word line WL and the other end of the variable resistor R is connected to one end of the bi-directional diode D. The other end of the bi-directional diode D is connected to the bit line BL.

Figure 2:
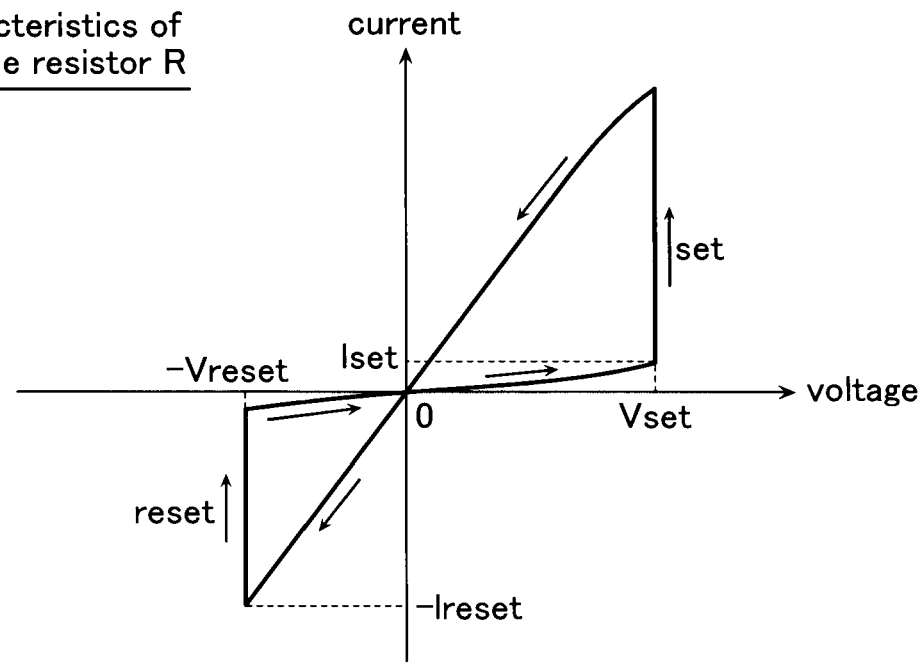
FIG. 2 is a view showing characteristics of a variable resistor R.

The variable resistor R is an element that undergoes transition between at least two resistance values, for example the two resistance values of a low-resistance state and a high-resistance state, and has characteristics as shown in FIG. 2. In other words, when applied with a certain constant voltage of a positive polarity, the variable resistor R undergoes transition from the high-resistance state to the low-resistance state (write, setting). Furthermore, when applied with a certain constant voltage of a negative polarity, the variable resistor R undergoes transition from the low-resistance state to the high-resistance state (erase, resetting). Note that the variable resistor R is configured to have its resistance value changed by a voltage based on a charge discharged from a capacitor to be described hereafter.

Here, as shown in FIG. 2, if a voltage required for setting is assumed to be Vset, a voltage required for resetting is assumed to be −Vreset, and a voltage required for read is assumed to be Vread, the relationship between the voltages is −Vreset<Vread<Vset. In addition, a current flowing in the variable resistor R during setting is assumed to be Iset and a current flowing in the variable resistor R during resetting is assumed to be Ireset.

Figure 3:
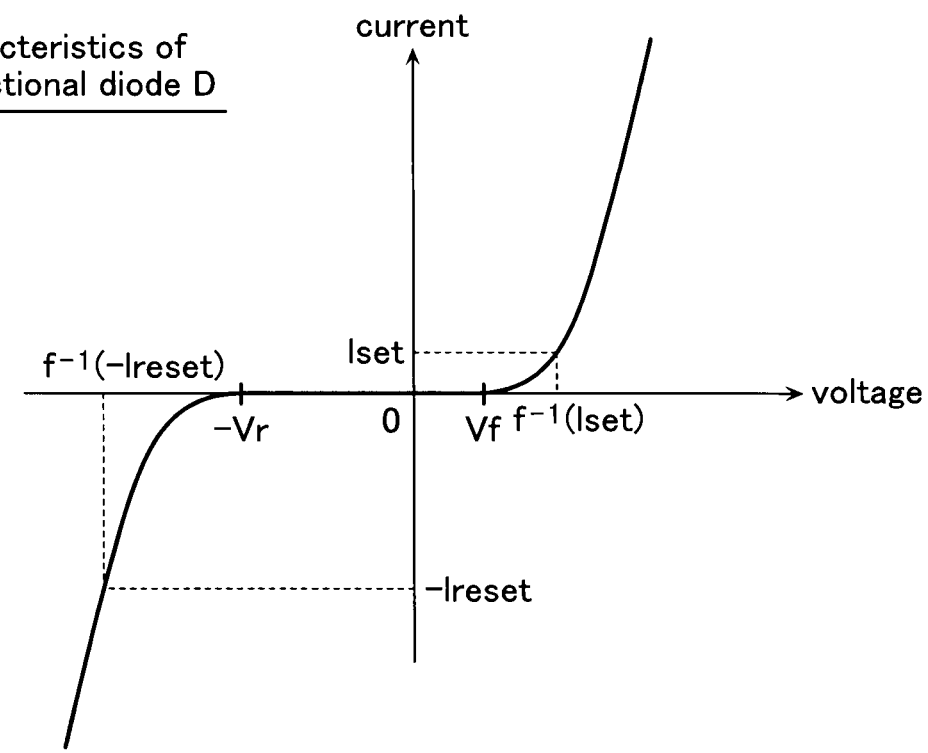
FIG. 3 is a view showing characteristics of a bi-directional diode D.

The bi-directional diode D has characteristics as shown in FIG. 3. In other words, applying a voltage of a certain value or above to the bi-directional diode D enables a current to flow in either a positive or a negative direction. The bi-directional diode D is configured by such as a tunnel diode (MIM diode) or a pin diode, for example. Here, a turn-on voltage at which current begins to flow in the diode is expressed as Vf for the positive direction and −Vr for the negative direction.

Now, the current-voltage characteristics of the bi-directional diode D are expressed here as a function f, of which an inverse function is assumed to be $f^{-1}$, whereby the relationship between the current I and the voltage V of the bi-directional diode D is expressed as I=f(V) or V=$f^{-1}$(I). In this case, a voltage applied to the bi-directional diode D when setting or resetting the variable resistor R having the characteristics shown in FIG. 2 is $f^{-1}$(Iset) or $f^{-1}$(Ireset).

Furthermore, assuming a write to the memory cell M (setting), a voltage Vpgm required for the write has a value (Vset+$f^{-1}$(Iset)), that is, a value of the voltage $f^{-1}$(Iset) required to cause the current Iset to flow in the bi-directional diode D added to the voltage Vset at which the variable resistor R undergoes transition from the high-resistance state to the low-resistance state. Moreover, to take account of voltage variations, the voltage Vpgm required for the write must be topped up with a voltage of value +α which is about 10% of Vpgm to prevent a trouble in circuit operations, whereby Vpgm=Vset+$f^{-1}$(Iset)+α.

On the other hand, assuming an erase of the memory cell M (resetting), a negative voltage −Vera required for the erase has a value (−Vreset+$f^{-1}$(Ireset)), that is, a value of the voltage $f^{-1}$(Ireset) required to cause the current Ireset to flow in the bi-directional diode D added to the voltage −Vreset at which the variable resistor R undergoes transition from the low-resistance state to the high-resistance state. Moreover, to take account of voltage variations, the negative voltage −Vera required for the erase must be topped up with a voltage of value −β (where β is a positive value) which is about 10% of −Vera to prevent a trouble in circuit operations, whereby Vera=−Vreset+$f^{-1}$(Ireset)−β.

The peripheral circuit 11 include an address buffer circuit 12, a first decoder circuit 13, a second decoder circuit 14, and a voltage control circuit 15, as shown in FIG. 1.

The address buffer circuit 12 receives an input of address signals during read/write/erase. The address buffer circuit 12 inputs one portion of the address signals (address signals RA1 and RA2) to the first decoder circuit 13 and inputs another portion of the address signals (address signals CA1 and CA2) to the second decoder circuit 14.

The first decoder circuit 13 selects one of the word lines WL1-WL4 on the basis of the address signals RA1 and RA2. The second decoder circuit 14 selects one of the bit lines BL1-BL4 on the basis of the address signals CA1 and CA2.

The first decoder circuit 13 includes switch circuits RSW1-RSW4, AND circuits RAD1-RAD4, and lines La1 and La2. The line La1 is applied with a voltage pulse from a voltage pulse generating circuit 152, or is connected to a ground voltage GND, depending on a switch RSW0. The line La2 is fixedly supplied with a power-supply voltage from a power-supply 154.

For example, when the address signals RA1 and RA2 are both "L", the AND circuit RAD1 outputs a signal "H". On the basis of this signal, the switch circuit RSW1 connects the word line WL1 to the line La1. At this time, the AND circuits RAD2, RAD3, and RAD4 output a signal "L". On the basis of this signal, the switch circuits RSW2, RSW3, and RSW4 connect the word lines WL2, WL3, and WL4 to the line La2.

For example, when the address signal RA1 is "H" and the address signal RA2 is "L", the AND circuit RAD2 outputs a signal "H". On the basis of this signal, the switch circuit RSW2 connects the word line WL2 to the line La1. At this time, the AND circuits RAD1, RAD3, and RAD4 output a signal "L". On the basis of this signal, the switch circuits RSW1, RSW3, and RSW4 connect the word lines WL1, WL3, and WL4 to the line La2.

For example, when the address signal RA1 is "L" and the address signal RA2 is "H", the AND circuit RAD3 outputs a signal "H". On the basis of this signal, the switch circuit RSW3 connects the word line WL3 to the line La1. At this time, the AND circuits RAD1, RAD2, and RAD4 output a signal "L". On the basis of this signal, the switch circuits RSW1, RSW2, and RSW4 connect the word lines WL1, WL2, and WL4 to the line La2.

For example, when the address signals RA1 and RA2 are both "H", the AND circuit RAD4 outputs a signal "H". On the basis of this signal, the switch circuit RSW4 connects the word line WL4 to the line La1. At this time, the AND circuits RAD1, RAD2, and RAD3 output a signal "L". On the basis of this signal, the switch circuits RSW1, RSW2, and RSW3 connect the word lines WL1, WL2, and WL3 to the line La2.

The second decoder circuit 14 includes switch circuits CSW1-CSW4, AND circuits CAD1-CAD4, and lines Lb1 and Lb2. The line Lb1 is connected to a capacitor 153, or is connected to the ground voltage GND, depending on a switch CSW0. The line Lb2 is fixedly supplied with the power-supply voltage from the power-supply 154, similarly to the line La2.

For example, when the address signals CA1 and CA2 are both "H", the AND circuit CAD1 outputs a signal "H". On the basis of this signal, the switch circuit CSW1 connects the bit line BL1 to the line Lb1. At this time, the AND circuits CAD2, CAD3, and CAD4 output a signal "L". On the basis of this signal, the switch circuits CSW2, CSW3, and CSW4 connect the bit lines BL2, BL3, and BL4 to the line Lb2.

For example, when the address signal CA1 is "L" and the address signal CA2 is "H", the AND circuit CAD2 outputs a signal "H". On the basis of this signal, the switch circuit CSW2 connects the bit line BL2 to the line Lb1. At this time, the AND circuits CAD1, CAD3, and CAD4 output a signal "L". On the basis of this signal, the switch circuits CSW1, CSW3, and CSW4 connect the bit lines BL1, BL3, and BL4 to the line Lb2.

For example, when the address signal CA1 is "H" and the address signal CA2 is "L", the AND circuit CAD3 outputs a signal "H". On the basis of this signal, the switch circuit CSW3 connects the bit line BL3 to the line Lb1. At this time, the AND circuits CAD1, CAD2, and CAD4 output a signal "L". On the basis of this signal, the switch circuits CSW1, CSW2, and CSW4 connect the bit lines BL1, BL2, and BL4 to the line Lb2.

For example, when the address signals CA1 and CA2 are both "L", the AND circuit CAD4 outputs a signal "H". On the basis of this signal, the switch circuit CSW4 connects the bit line BL4 to the line Lb1. At this time, the AND circuits CAD1, CAD2, and CADS output a signal "L". On the basis of this signal, the switch circuits CSW1, CSW2, and CSW3 connect the bit lines BL1, BL2, and BL3 to the line Lb2.

The voltage control circuit 15 controls voltages of a selected word line WL, unselected word lines WL, a selected bit line BL, and unselected bit lines BL, respectively, as shown in FIG. 1. The voltage control circuit 15 is configured to apply a voltage pulse to the selected word line WL and to connect a capacitor of a certain capacitance to one end of the selected bit line BL. In addition, the voltage control circuit 15 charges the capacitor and then discharges the charge from the capacitor.

The voltage control circuit 15 includes a control circuit 151, the voltage pulse generating circuit 152, the capacitor 153, the power-supply 154, and the switches RSW0 and CSW0.

The control circuit 151 outputs a control signal CNT to the voltage pulse generating circuit 152 during write (setting) or erase (resetting), the control signal CNT being configured to authorize generation of a voltage pulse.

The voltage pulse generating circuit 152, on receiving the control signal CNT, generates a voltage pulse having a certain magnitude (voltage value) and a certain width (duration). An output terminal of the voltage pulse generating circuit 152 is configured to be connectable to the line La1 via the switch RSW0. The voltage pulse outputted from the voltage pulse generating circuit 152 is thus supplied to selected one of the word lines WL1-WL4 via the first decoder circuit 13.

The capacitor 153 has one end fixed to the ground voltage GND and the other end connectable to the line Lb1 via the switch CSW0.

The power-supply 154 fixedly supplies the power-supply voltage to the lines La2 and Lb2. That is, the power-supply 154 fixes the unselected word lines WL and unselected bit lines BL at the power-supply voltage via the lines La2 and Lb2.

During write (setting), the switch RSW0 connects the line La1 to the output terminal of the voltage pulse generating circuit 152. In addition, during erase (resetting), the switch RSW0 first connects the line La1 to the output terminal of the voltage pulse generating circuit 152, and then connects the line La1 to the ground voltage GND.

During write (setting), the switch CSW0 connects the line Lb1 to the ground voltage GND. In addition, during erase (resetting), the switch CSW0 connects the line Lb1 to the other end of the capacitor 153.

[Operation of the Nonvolatile Semiconductor Memory Device in Accordance with the First Embodiment]

Figure 4:
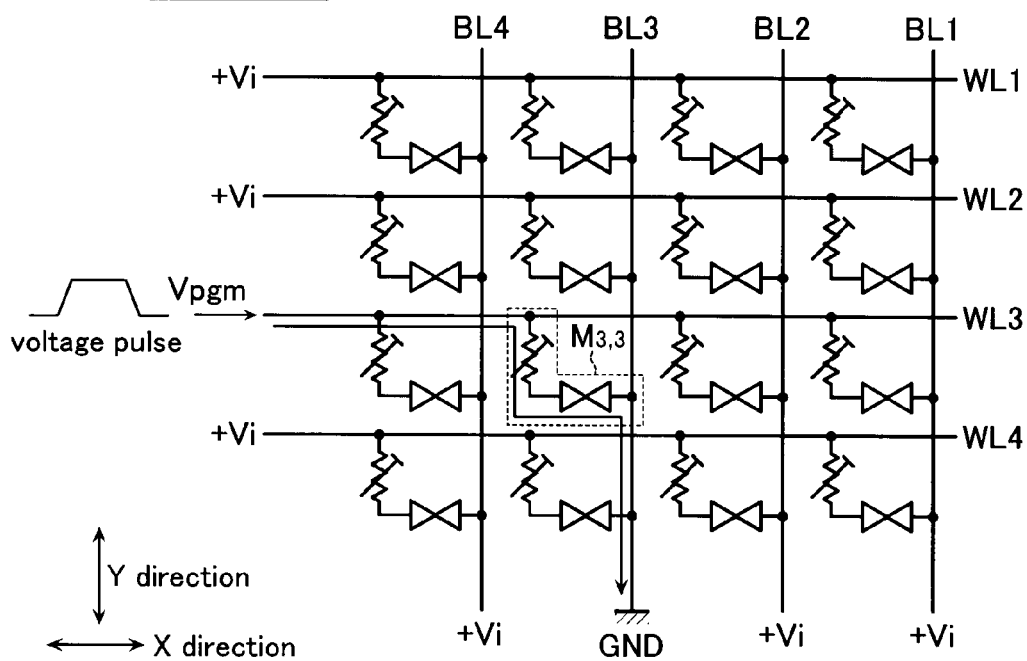
FIG. 4 is a view showing a write (setting) operation in accordance with a first embodiment.
Figure 5A:
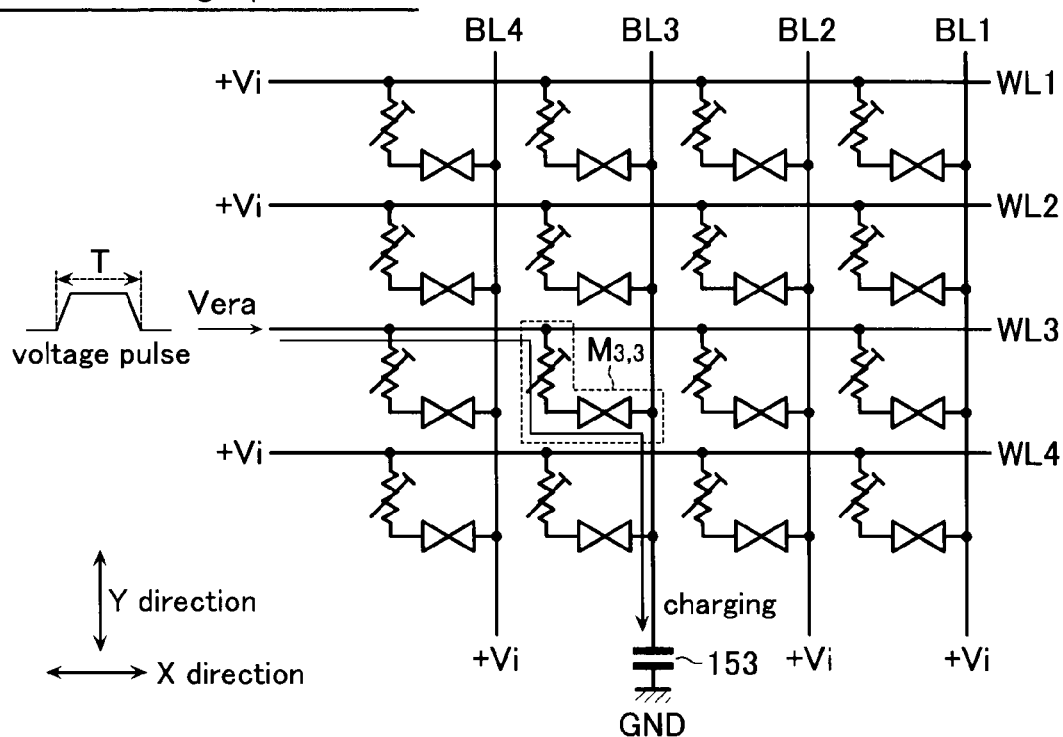
FIG. 5A is a view showing an erase (resetting) operation in accordance with the first embodiment.
Figure 5B:
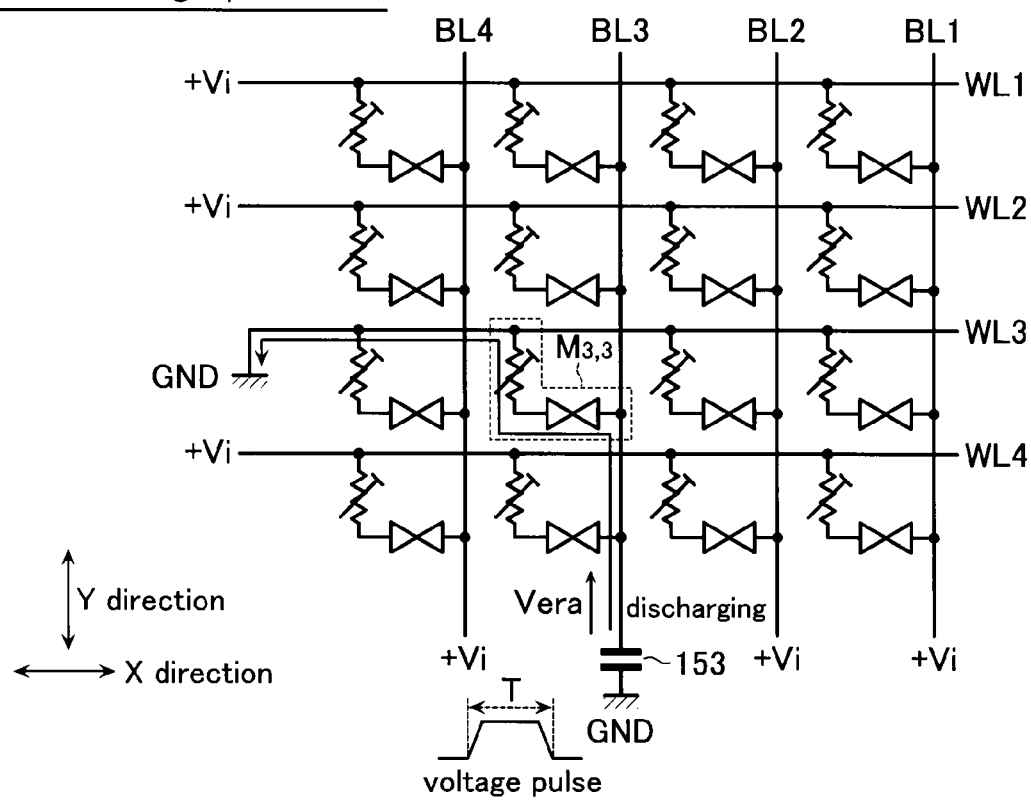
FIG. 5B is a view showing the erase (resetting) operation in accordance with the first embodiment.

Next, write/erase operations in the nonvolatile semiconductor memory device in accordance with the first embodiment are described with reference to FIGS. 4, 5A, and 5B. FIG. 4 is a schematic view describing the write operation in accordance with the first embodiment, and FIGS. 5A and 5B are schematic views describing the erase operation in accordance with the first embodiment.

[Write Operation]

In the write operation, a single selected word line WL3 is applied with a voltage pulse outputted from the voltage pulse generating circuit 152, as shown in FIG. 4. A magnitude of the voltage pulse Vpgm is (Vset+$f^{-1}$(Iset)+α). In addition, a single selected bit line BL3 is set to the ground voltage GND. Unselected word lines WL1, WL2, and WL4, and unselected bit lines BL1, BL2, and BL4 are fixed at a voltage +Vi.

The above-described voltages cause a selected memory cell M(sel)($M_{3,3}$) to have its variable resistor R applied with a voltage exceeding Vset, and thereby to undergo a write (setting).

Note that, in order to prevent a mistaken write in a plurality of unselected memory cells M(unsel) linked to the selected word line WL3 and selected bit line BL3, values of Vpgm and Vi must be chosen such that a voltage applied to the bi-directional diode D does not exceed $f^{-1}$(Iset). Specifically, values are set such that Vi=Vpgm/2. Furthermore, from a viewpoint of curbing power consumption, it is desirable to manufacture the bi-directional diode D such that Vpgm/2<Vf to prevent the diode from being turned on.

[Erase Operation]

In the erase operation, first, the selected word line WL3 is applied with a voltage pulse outputted from the voltage pulse generating circuit 152, as shown in FIG. 5A. A magnitude of the voltage pulse Vera is |–Vreset+$f^{-1}$(Ireset)–β|. In addition, the selected bit line BL3 is connected to the capacitor 153. The unselected word lines WL1, WL2, and WL4, and unselected bit lines BL1, BL2, and BL4 are fixed at a fixed potential, for example, the voltage +Vi.

The voltage pulse of amplitude Vera and certain duration T causes the capacitor 153 to be charged via the selected memory cell M(sel)($M_{3,3}$) to a voltage of about Vera. A time constant at this time is the product of the resistance in the forward direction of the cell in the low-resistance state and the capacitor 153. The duration T of the voltage pulse is set to be about 1.5 times to 3 times this time constant, and it is desirable that the capacitor 153 be sufficiently charged to about Vera.

In the state shown here in FIG. 5A, although a maximum voltage of |–Vreset+$f^{-1}$(Ireset)–β| may be applied to the variable resistor R in the selected memory cell M(sel), the erase (resetting) operation does not occur, since the polarity of the voltage is in a forward direction.

Following the state of FIG. 5A, the selected word line WL3 is set to the ground voltage GND, as shown in FIG. 5B. At the same time, the selected bit line BL3 is held connected to the capacitor 153. The unselected word lines WL1, WL2, and WL4, and unselected bit lines BL1, BL2, and BL4 are fixed at a fixed potential, for example, the voltage +Vi.

In this state, discharge from the capacitor 153 causes a voltage pulse of a maximum of about Vera to be applied in a reverse direction to the selected memory cell M(sel) for the certain duration T. A reverse direction voltage exceeding Vreset is thereby applied to the variable resistor R, causing an erase (resetting) to be executed.

Note that in the series of erase (resetting) operations shown in the above-described FIGS. 5A and 5B, in order to prevent a mistaken write and a mistaken erase in the unselected memory cells M(unsel) linked to the selected word line WL3 and selected bit line BL3, values of Vera and Vi must be chosen such that a voltage applied to the bi-directional diode D does not become larger than $f^{-1}$(Iset) and, in addition, does not become smaller than $f^{-1}$(–Ireset). Specifically, values are set such that Vi=Vera/2. Furthermore, from a viewpoint of curbing power consumption, it is desirable to set Vera/2<Vf and –Vera/2>–Vr to prevent the diode from being turned on.

[Stacking Structure of the Nonvolatile Semiconductor Memory Device in Accordance with the First Embodiment]

Figure 6:
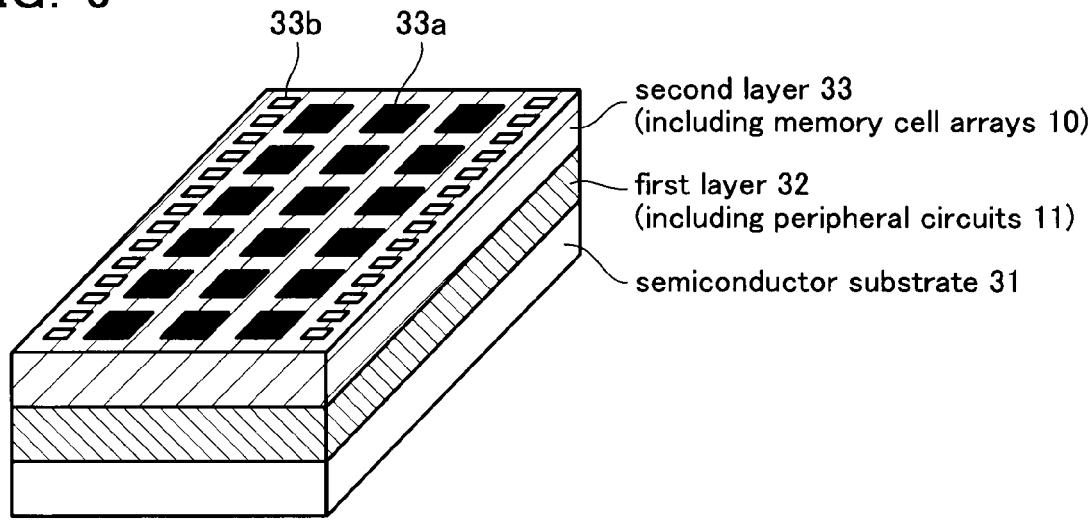
FIG. 6 is a schematic view showing a stacking structure of the nonvolatile semiconductor memory device in accordance with the first embodiment.

Next, a stacking structure of the nonvolatile semiconductor memory device in accordance with the first embodiment is described with reference to FIG. 6. FIG. 6 is a schematic view showing the stacking structure of the nonvolatile semiconductor memory device in accordance with the first embodiment.

The nonvolatile semiconductor memory device in accordance with the first embodiment includes a first layer 32 and a second layer 33 stacked on a semiconductor substrate (for example, a silicon substrate) 31, as shown in FIG. 6. The first layer 32 includes the aforementioned peripheral circuits 11. The second layer 33 includes the aforementioned memory cell arrays 10. These first layer 32 and second layer 33 are connected to each other by through-holes.

The first layer 32 excluding a connection portion with the second layer 33 is formed with a pitch that is wider than that of the word lines WL and bit lines BL in the second layer 33, for example, a 90 nm design rule. The capacitor 153 in the first layer 32 is configured by a trench structure.

The second layer 33 includes memory cell array areas 33a and input/output (I/O) areas 33b. The memory cell array areas 33a are disposed in a matrix and are regions each configuring the memory cell array 10. A size of the memory cell array area 33a is, for example, 22 μm×22 μm, and formed within this area are, for example, 512×512 memory cells M. The input/output area 33b includes a pad connected to a lead frame in an assembly process. Note that connection of the pad and the lead frame is performed by bonding wire, for example.

Figure 7:
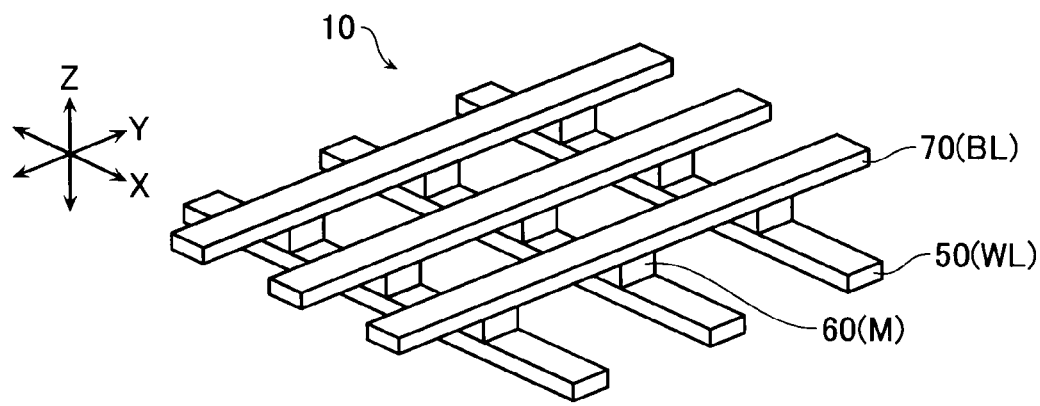
FIG. 7 is a perspective view showing a memory cell array 10.

Next, a stacking structure of the memory cell array 10 included in the second layer 33 is described in detail with reference to FIG. 7. FIG. 7 is a perspective view showing the memory cell array 10. The memory cell array 10 is configured as a so-called cross-point type.

The memory cell array 10 includes, from a lower layer to an upper layer, a first conductive layer 50, a memory layer 60, and a second conductive layer 70, as shown in FIG. 7. The first conductive layer 50 functions as the word lines WL. The memory layer 60 functions as the memory cells M. The second conductive layer 70 functions as the bit lines BL.

The first conductive layer 50 is formed in stripes extending in the X direction and having a certain pitch in the Y direction, as shown in FIG. 7. The first conductive layer 50 is constituted by metal. The first conductive layer 50 is preferably constituted by a material that is heat-resistant and has a low resistance value, for example, by tungsten (W), titanium (Ti), tantalum (Ta), and their nitrides, or by a laminated structure of these metals and their nitrides, and so on. Specifically, the first conductive layer 50 is configured with a pitch of 44 nm, that is, by a line of line width 22 nm and a space of 22 nm.

The memory layer 60 is provided on the first conductive layer 50 and arranged in a matrix in the X direction and the Y direction, as shown in FIG. 7.

The second conductive layer 70 is formed in stripes extending in the Y direction and having a certain pitch in the X direction, as shown in FIG. 7. The second conductive layer 70 is formed so as to be in contact with an upper surface of the memory layer 60. The second conductive layer 70 is preferably constituted by a material that is heat-resistant and has a low resistance value, for example, by tungsten (W), titanium (Ti), tantalum (Ta), and their nitrides, or by a laminated structure of these metals and their nitrides, and so on. Specifically, the second conductive layer 70 is configured with a pitch of 44 nm, that is, by a line of line width 22 nm and a space of 22 nm.

Figure 8:
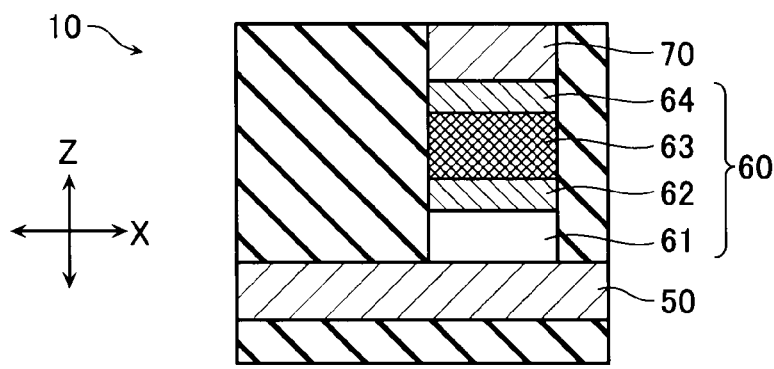
FIG. 8 is a cross-sectional view of FIG. 7.

Next, a stacking structure of the memory layer 60 is described in detail with reference to FIG. 8. FIG. 8 is a cross-sectional view of FIG. 7.

The memory layer 60 includes, from a lower layer to an upper layer, a diode layer 61, a first electrode layer 62, a variable resistance layer 63, and a second electrode layer 64, as shown in FIG. 8.

The diode layer 61 is formed on an upper surface of the first conductive layer 50. The diode layer 61 functions as the bi-directional diode D. The diode layer 61 is configured by the likes of a tunnel diode (MIN diode) having an Al—GaSe—Au or Al—Al$_2$O$_3$—Al structure, or a pin diode constituted from silicon and characterized by having a thin depletion layer.

The first electrode layer 62 is formed on an upper surface of the diode layer 61. The first electrode layer 62 is constituted by TiN or TaN. Moreover, the first electrode layer 62 maybe constituted by TiO$_2$ doped with Pt, W, WN, and Nb.

The variable resistance layer 63 is formed on an upper surface of the first electrode layer 62. The variable resistance layer 63 functions as the variable resistor R. The variable resistance layer 63 is constituted by one material selected from Pr$_{0.7}$Ca$_{0.3}$MnO$_3$, SrTi$_{1-x}$Nb$_x$O$_3$, Sm$_{0.7}$Ca$_{0.3}$MnO$_3$, GdO$_x$, Fe$_3$O$_4$, γ-Fe$_2$O$_3$, GeSe, and Cu$_2$S.

The second electrode layer 64 is formed between an upper surface of the variable resistance layer 63 and a lower surface of the second conductive layer 70. The second electrode layer 64 is constituted by a material similar to that of the first electrode layer 62.

[Advantages of the Nonvolatile Semiconductor Memory Device in Accordance with the First Embodiment]

In the nonvolatile semiconductor memory device in accordance with the first embodiment, the voltage pulse generating circuit 152 is disposed to make connection only with the word lines WL and functions solely to generate a pulse with a positive polarity. In addition, the nonvolatile semiconductor memory device is configured such that charging of the capacitor 153 can be utilized to allow write and erase of the selected memory cell M(sel) to be performed. Consequently, the nonvolatile semiconductor memory device in accordance with the first embodiment enables circuit configuration to be simplified and circuit area to be reduced.

Second Embodiment

[Circuit Configuration of a Nonvolatile Semiconductor Memory Device in Accordance with a Second Embodiment]

Figure 9:
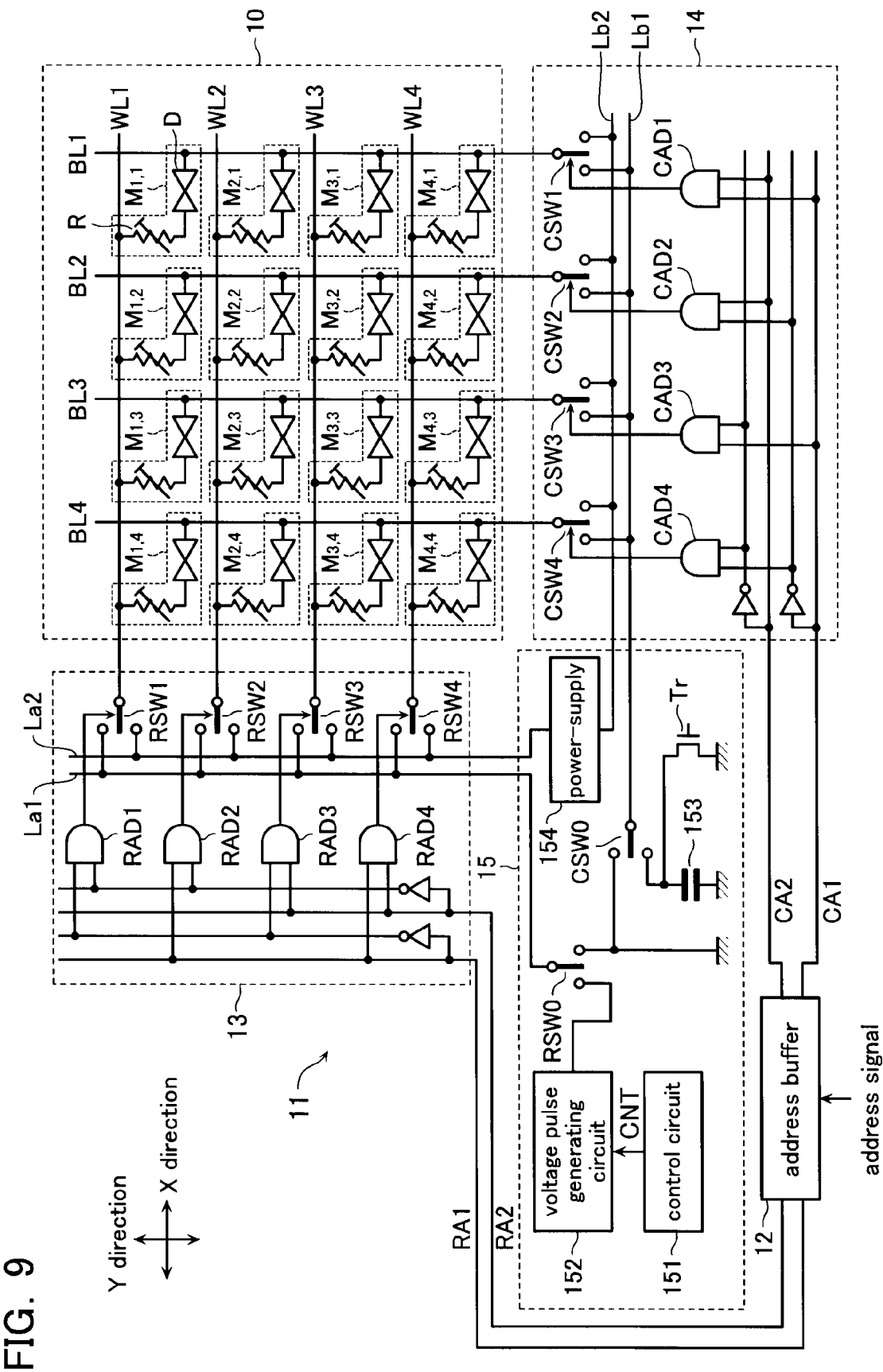
FIG. 9 is an equivalent circuit diagram of a nonvolatile semiconductor memory device in accordance with a second embodiment of the present invention.

Next, a circuit configuration of a nonvolatile semiconductor memory device in accordance with a second embodiment is described with reference to FIG. 9. FIG. 9 is an equivalent circuit diagram of the nonvolatile semiconductor memory device in accordance with the second embodiment. Note that in the second embodiment, identical symbols are assigned to configurations similar to those in the first embodiment and descriptions thereof are omitted.

As shown in FIG. 9, the nonvolatile semiconductor memory device in accordance with the second embodiment differs from that of the first embodiment in including a transistor Tr (MOSFET) having an end (drain) connected to between the capacitor 153 and the switch CSW0 (an end of the capacitor 153 connected to the selected bit line BL). The other end (source) of the transistor Tr is grounded.

[Operation of the Nonvolatile Semiconductor Memory Device in Accordance with the Second Embodiment]

[Erase Operation]

In an erase operation of the second embodiment, the transistor Tr is turned on subsequent to completion of the erase operation. This causes a charge charged to the capacitor 153 to be discharged via the transistor Tr.

[Advantages of the Nonvolatile Semiconductor Memory Device in Accordance with the Second Embodiment]

In the nonvolatile semiconductor memory device in accordance with the second embodiment, the transistor Tr allows the charge charged to the capacitor 153 to be discharged more rapidly subsequent to completion of the erase operation than in the first embodiment.

Other Embodiments

This concludes description of embodiments of the nonvolatile semiconductor memory device in accordance with the present invention, but it should be noted that the present invention is not limited to the above-described embodiments, and that various alterations, additions, substitutions, and so on, are possible within a range not departing from the scope and spirit of the invention.

For example, the capacitor 153 is not limited to the trench structure in accordance with the first embodiment, and may have a stack structure. Moreover, it is desirable that the capacitor 153 be set with consideration for parasitic capacitance of conductive lines transferring the voltage pulse. The capacitor 153 may thus be one configured solely by the parasitic resistance of the conductive lines.

For example, the second layer 33 (memory cell array 11) is one layer only. However, the second layer 33 may be stacked in a plurality of layers. Adopting such a configuration allows a large memory capacity to be secured without an accompanying increase in chip area.

For example, in the above-described embodiments, one end of the capacitor 153 is set to the ground voltage GND, but may be set to another voltage Va. In such a case, the selected word line WL3 in the erase operation shown in FIG. 5A need only be applied with a voltage pulse that is matched to the voltage Va.

For example, in the above-described embodiments, the selected word line WL3 in the erase operation shown in FIG. 5B is set to the ground voltage GND, but may be set to another voltage Vb. In such a case, the selected word line WL3 in the erase operation shown in FIG. 5A need only be applied with a voltage pulse that is matched to the voltage Vb.

What is claimed is:

1. A nonvolatile semiconductor memory device, comprising:
    a plurality of first lines;
    a plurality of second lines extending so as to cross the first lines;
    a plurality of memory cells each disposed at each of crossing-points of the first lines and the second lines and each comprising a variable resistor and a bi-directional diode;
    a first select circuit configured to select one of the first lines;
    a second select circuit configured to select one of the second lines; and
    a voltage control circuit configured to control a voltage of selected one of the first lines, unselected ones of the first lines, selected one of the second lines, and unselected ones of the second lines, respectively,
    the variable resistor being configured to change its resistance value depending on a polarity of a voltage applied thereto, and
    the voltage control circuit being configured to apply a voltage pulse to the selected one of the first lines and to connect a capacitor of a certain capacitance to one end of the selected one of the second lines.

2. The nonvolatile semiconductor memory device according to claim 1,
wherein the voltage control circuit charges the capacitor with a charge and then discharges the capacitor, and
the variable resistor is configured such that the resistance value of the variable resistor is changed by a voltage caused by charges discharged from the capacitor.

3. The nonvolatile semiconductor memory device according to claim 2,
wherein the voltage control circuit fixes one end of the capacitor at a first voltage and sets the selected one of the first lines to a second voltage higher than the first voltage for a first time period in a state where the capacitor is connected to the selected one of the second lines thereby charging the capacitor, and
the voltage control circuit then fixes the selected one of the first lines at a third voltage lower than the second voltage thereby discharging the capacitor for a second time period.

4. The nonvolatile semiconductor memory device according to claim 3,
wherein the first time period is equal to the second time period.

5. The nonvolatile semiconductor memory device according to claim 1, further comprising a transistor having a drain connected to one end of the capacitor connected to one of the second lines, a source of the transistor being grounded.

6. The nonvolatile semiconductor memory device according to claim 1, further comprising:
a third line applied with the pulse voltage or a ground voltage;
a fourth line supplied with a charge held by the capacitor or the ground voltage;
a fifth line fixedly supplied with a power-supply voltage;
a first switch circuit configured to connect the third line or the fifth line to the first lines; and
a second switch circuit configured to connect the fourth line or the fifth line to the second lines.

7. The nonvolatile semiconductor memory device according to claim 6, wherein the voltage control circuit comprising:
a voltage pulse generating circuit configured to generate the voltage pulse;
a power-supply configured to fixedly supply the power-supply voltage to the fifth line;
a third switch circuit configured to connect the third line to an output terminal of the voltage pulse generating circuit or to the ground voltage; and
a fourth switch circuit configured to connect the fourth line to the capacitor or to the ground voltage.

8. The nonvolatile semiconductor memory device according to claim 1,
wherein the variable resistor attains a first state or a second state each having a different value from each other, depending on a polarity of a voltage applied thereto, and
where a fourth voltage is defined as a voltage required for the variable resistor to be set to the first state, and a fifth voltage is defined as a voltage applied to a selected bi-directional diode when the fourth voltage is applied to a selected variable resistor,
the voltage control circuit applies a sixth voltage larger than a sum of the fourth voltage and the fifth voltage to a selected one of the memory cells when the variable resistor is set to the first state.

9. The nonvolatile semiconductor memory device according to claim 8,
wherein, when setting the variable resistor to the first state, the voltage control circuit applies a voltage to the unselected ones of the first lines and the unselected ones of the second lines such that unselected ones of the memory cells connected to the selected one of the first lines or the selected one of the second lines are applied with a seventh voltage being half of the sixth voltage.

10. The nonvolatile semiconductor memory device according to claim 9,
wherein the bi-directional diode is configured so as not to be turned on by the seventh voltage.

11. The nonvolatile semiconductor memory device according to claim 1,
wherein the variable resistor is constituted by one material selected from $Pr_{0.7}Ca_{0.3}MnO_3$, $SrTi_{1-x}Nb_xO_3$, $Sm_{0.7}Ca_{0.3}MnO_3$, $GdO_x$, $Fe_3O_4$, $\gamma\text{-}Fe_2O_3$, $GeSe$, and $Cu_2S$.

12. The nonvolatile semiconductor memory device according to claim 1,
wherein the bi-directional diode is configured by a MIM diode or a pin diode.

13. The nonvolatile semiconductor memory device according to claim 1,
wherein the first lines and the second lines are configured by the likes of tungsten (W), titanium (Ti), tantalum (Ta), or by nitrides of W, Ti, Ta, or by laminated structures of W, Ti, Ta and the nitrides.

14. The nonvolatile semiconductor memory device according to claim 1, comprising:
a first electrode provided on one surface of the variable resistor; and
a second electrode provided on the other surface of the variable resistor,
the first electrode and the second electrode being constituted by $TiO_2$ doped with TiN or TaN, or Pt, W, WN, and Nb.

15. A method of data write/data erase in a nonvolatile semiconductor memory device, the nonvolatile semiconductor memory device including a plurality of first lines, a plurality of second lines extending so as to cross the first lines, and a plurality of memory cells each disposed at each of crossing-points of the first lines and the second lines and each comprising a variable resistor and a bi-directional diode, the variable resistor being configured to change its resistance value depending on a polarity of a voltage applied thereto, comprising:
applying a voltage pulse to selected one of the first lines and connecting a capacitor of a certain capacitance to one end of a selected one of the second lines, thereby charging the capacitor;
discharging the capacitor subsequent to charging the capacitor; and
changing the resistance value of the variable resistor by a voltage caused by charges discharged from the capacitor.

16. The method of data write/data erase in a nonvolatile semiconductor memory device according to claim 15,
wherein one end of the capacitor is fixed at a first voltage and the selected one of the first lines is set to a second voltage higher than the first voltage for a first time period in a state where the capacitor is connected to the selected one of the second lines thereby charging the capacitor, and
the selected one of the first lines is then fixed at a third voltage lower than the second voltage thereby discharging the capacitor for a second time period.

17. The method of data write/data erase in a nonvolatile semiconductor memory device according to claim 16,
wherein the first time period is equal to the second time period.

* * * * *